(12) United States Patent
Myers et al.

(10) Patent No.: US 10,879,575 B2
(45) Date of Patent: Dec. 29, 2020

(54) EMBEDDED FILTERING IN PCB INTEGRATED ULTRA HIGH SPEED DIELECTRIC WAVEGUIDES USING PHOTONIC BAND GAP STRUCTURES

(71) Applicant: International Business Machines Corporation, Armonk, NY (US)

(72) Inventors: Joshua Myers, Austin, TX (US); Jose A. Hejase, Austin, TX (US); Junyan Tang, Austin, TX (US); Daniel M. Dreps, Georgetown, TX (US)

(73) Assignee: International Business Machines Corporation, Armonk, NY (US)

( * ) Notice: Subject to any disclaimer, the term of this patent is extended or adjusted under 35 U.S.C. 154(b) by 118 days.

(21) Appl. No.: 16/151,856

(22) Filed: Oct. 4, 2018

(65) Prior Publication Data
US 2020/0112075 A1    Apr. 9, 2020

(51) Int. Cl.
| | | |
|---|---|---|
| *H01P 1/20* | (2006.01) | |
| *H01P 3/16* | (2006.01) | |
| *H05K 1/02* | (2006.01) | |
| *H01P 11/00* | (2006.01) | |
| *H05K 1/11* | (2006.01) | |

(52) U.S. Cl.
CPC .......... *H01P 1/2005* (2013.01); *H01P 1/2002* (2013.01); *H01P 3/16* (2013.01); *H01P 11/006* (2013.01); *H01P 11/007* (2013.01); *H05K 1/0216* (2013.01); *H05K 1/115* (2013.01)

(58) Field of Classification Search
CPC ......... H01P 1/2002; H01P 3/16; H01P 1/2005
USPC ................................................. 333/208, 212
See application file for complete search history.

(56) References Cited

U.S. PATENT DOCUMENTS

| | | |
|---|---|---|
| 8,004,369 B2 | 8/2011 | Kwon et al. |
| 8,004,375 B2 | 8/2011 | Hwang et al. |
| 8,907,748 B2 | 12/2014 | Pajovic |
| 9,000,869 B2 | 4/2015 | McKinzie, III |
| 9,634,369 B2 | 4/2017 | Toyao |

(Continued)

OTHER PUBLICATIONS

Rostami et al., "An ultra compact photonic crystal wavelength division demultiplexer using resonance cavities in a modified Y-branch structure,". Optik-International Journal for Light and Electron Optics, vol. 122, No. 16, 2011, pp. 1481-1485.

(Continued)

*Primary Examiner* — Rakesh B Patel
(74) *Attorney, Agent, or Firm* — Yee & Associates, P.C.

(57) ABSTRACT

A method and apparatus for attenuating crosstalk between dielectric waveguides is provided. A first dielectric waveguide is formed to carry a first frequency band. A first filter is embedded within the first dielectric waveguide to attenuate transmission of a second frequency band through the first dielectric waveguide. The filter comprises alternating sections of a first dielectric material and a second dielectric material having different dielectric constants. The length of each section of the first and second dielectric materials is equal to a quarter of the wavelength of the central frequency of the second frequency band. A second waveguide is formed to carry the second frequency band. A second filter is embedded in the second dielectric waveguide to attenuate transmission of the first frequency band through the second dielectric waveguide. A cladding is disposed between the first and second waveguides.

20 Claims, 9 Drawing Sheets

(56) References Cited

U.S. PATENT DOCUMENTS

| | | |
|---|---|---|
| 9,717,140 B2 | 7/2017 | Contreras et al. |
| 2006/0232363 A1* | 10/2006 | Reynolds ............ H01P 1/20 |
| | | 333/202 |
| 2015/0295300 A1* | 10/2015 | Herbsommer ........ H01P 3/122 |
| | | 333/208 |
| 2017/0040659 A1* | 2/2017 | Morgan ............ H01P 3/165 |
| 2018/0108971 A1 | 4/2018 | Connor et al. |
| 2018/0115042 A1 | 4/2018 | Connor et al. |
| 2018/0115043 A1 | 4/2018 | Dreps et al. |

OTHER PUBLICATIONS

Zhu et al., "Low-Cost Narrowed Dielectric Microstrip Line—A Three-Layer Dielectric Waveguide Using PCB Technology for Millimeter-Wave Applications," IEEE Transactions on Microwave Theory and Techniques, vol. 65, No. 1, Jan. 2017, pp. 119-127.

Myers et al., "Embeded Filtering in PCB Integrated Ultra High Speed Dielectric Waveguides Using Photonic Band Gap Structures," IEEE 26th Conference on Electrical Performance of Electronic Packaging and Systems (EPEPS), Oct. 15-18, 2017, San Jose, California, 3 pages.

\* cited by examiner

EMBEDDED FILTERING IN PCB INTEGRATED ULTRA HIGH SPEED DIELECTRIC WAVEGUIDES USING PHOTONIC BAND GAP STRUCTURES

BACKGROUND

The disclosure relates generally to multi-layer printed circuit boards (PCB), and more specifically to dielectric waveguides with PCBs.

In recent years, there has been a significant push to increase the operating frequency and bandwidth of integrated PCB technologies. However, this has become a difficult problem to overcome, as current trace wave-guiding copper based technologies, such as strip-lines and micro-strip lines, have been shown to exhibit high losses at frequencies exceeding 50 GHz. This is primarily attributed to the skin effect losses associated with the metal used to create the wave guiding structures. Fortunately, an increased effort has been given to developing high-speed waveguides that do not rely on metallic traces to efficiently guide waves.

A number of alternative high frequency waveguides have been introduced. However, these waveguides are not ideal for integration within multi-layered PCBs. One such waveguide capable of low-loss, high frequency transmission is the dielectric ribbon waveguide. Dielectric ribbon waveguides have been shown to be efficient carriers of high frequency waves well above current speeds possible in strip-line technology. These waveguides primarily restrict the wave within a thin dielectric and its surrounding areas. Unfortunately, they suffer large losses at bends or curves, making them non-ideal for high-density integrated channels, which require complex structures.

In recent years, it has been shown that adding a cladding material around the ribbon can also help confine the wave closer to the core within the cladding region, reducing the losses in the regions surrounding the waveguide and reducing the losses in curved structures. Furthermore, dielectric waveguide have been integrated into a multilayered PCB environment, showing the capability of the waveguides to be used and excited in current PCB technologies. However, dense sets of dielectric waveguides contained within a PCB are potentially susceptible to high levels of crosstalk.

SUMMARY

An embodiment of the present disclosure provides a dielectric waveguide layer. The waveguide layer comprises a first dielectric core forming a first waveguide and a cladding disposed on opposite sides of the dielectric core, wherein the cladding has a lower dielectric constant than the first dielectric core. A first filter is embedded within the first dielectric core and configured to attenuate transmission of a first frequency band through the first waveguide. The first filter comprises alternating sections of a first dielectric material and a second dielectric having different dielectric constants. The length of each section of the first and second dielectric materials within the first filter is equal to a quarter of the wavelength of the central frequency of the first frequency band.

Another embodiment provides a multi-layer printed circuit board (PCB). The PCB comprises a first dielectric core forming a first waveguide configured to transmit a first frequency band. A first filter is embedded within the first dielectric core and configured to attenuate transmission of a second frequency band through the first waveguide. The first filter comprises alternating sections of a first dielectric material and a second dielectric having different dielectric constants, wherein the length of each section of the first and second dielectric materials within the first filter is equal to a quarter of the wavelength of the central frequency of the second frequency band. The PCB also comprises a second dielectric core forming a second waveguide configured to transmit the second frequency band. A second filter is embedded in the second dielectric core and configured to attenuate transmission of the first frequency band through the second waveguide, wherein the second filter comprises alternating sections of the first dielectric material and the second dielectric material. The length of each section of the first and second dielectric materials within the second filter is equal to a quarter of the wavelength of the central frequency of the first frequency band. A cladding is disposed between the first dielectric core and second dielectric core, wherein the cladding has a lower dielectric constant than the first and second dielectric cores. A first conductive ground layer is in contact with top surfaces of the first dielectric core, second dielectric core, and cladding, and a second conductive ground layer is in contact with bottom surfaces of the first dielectric core, second dielectric core, and cladding.

Another embodiment provides a method for attenuating crosstalk between dielectric waveguides. The method comprises forming a first dielectric waveguide to carry a first frequency band and embedding a first filter within the first dielectric waveguide to attenuate transmission of a second frequency band through the first dielectric waveguide. The first filter comprises alternating sections of a first dielectric material and a second dielectric material having different dielectric constants, wherein the length of each section of the first and second dielectric materials within the first filter is equal to a quarter of the wavelength of the central frequency of the second frequency band. A second dielectric waveguide is formed to carry the second frequency band and a second filter is embedded in the second dielectric waveguide to attenuate transmission of the first frequency band through the second dielectric waveguide. The second filter also comprises alternating sections of the first dielectric material and the second dielectric material, but the length of each section of the first and second dielectric materials within the second filter is equal to a quarter of the wavelength of the central frequency of the first frequency band. A cladding is disposed between the first dielectric waveguide and second dielectric waveguide, wherein the cladding has a lower dielectric constant than the first and second dielectric waveguides.

DETAILED DESCRIPTION

Aspects of the present invention are described herein with reference to diagrams of methods and apparatuses according to embodiments of the invention. The diagrams in the Figures illustrate the architecture and operation of possible implementation methods according to various embodiments of the present invention.

Embodiments herein describe a high-speed communication channel in a PCB that includes a dielectric waveguide. The dielectric waveguide includes a core and a cladding where the material of the core has a higher dielectric constant than the material of the cladding. Thus, electromagnetic signals propagating in the core are internally reflected at the interface between the core and cladding. The electromagnetic wave front may extend into the cladding depending on the core dimensions, material properties, and the wave's frequency of operation. In an embodiment, the dielectric waveguide is coupled at respective ends to coaxial vias that each include a center conductor and an outer conductor (or shield) which extend through one or more layers of the PCB. One of the coaxial vias radiates electromagnetic signals into the dielectric waveguide at a first end of the core while the other coaxial via receives the radiated signals at a second end of the core. For example, the center conductor extends into the core of the dielectric material and functions like an antenna to radiate the electromagnetic signal into the core. After traveling through the dielectric waveguide, the electromagnetic signal reaches the center conductor of another coaxial via which receives the signal. In an embodiment, the center conductors of the coaxial vias are bonded to respective integrated circuits (e.g., processors or application specific integrated circuits (ASICs)) mounted on the PCB. The integrated circuits can use the coaxial vias and dielectric waveguide to transmit high speed data signals (e.g., greater than 70 Gb/s) between each other.

Figure 1:
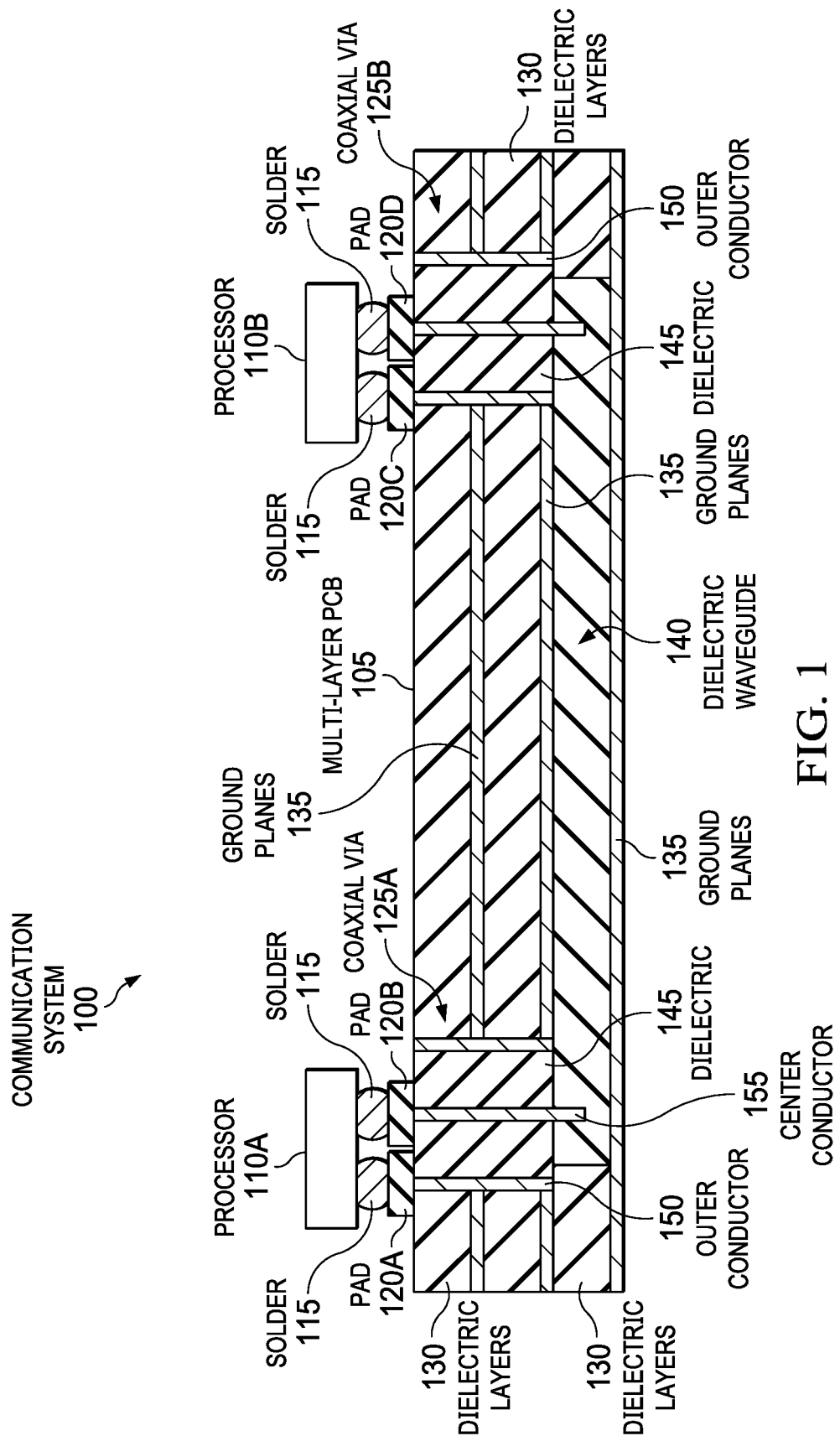
FIG. 1 is a diagram illustrating a communications system in accordance with illustrative embodiments.

FIG. 1 is a diagram illustrating a communications system in accordance with illustrative embodiments. The communication system 100 that includes a multi-layer PCB 105 with a dielectric waveguide 140, according to an embodiment described herein. As shown, the PCB 105 includes multiple dielectric layers 130 that are separated by ground planes 135. The dielectric layers 130 can be any rigid insulative material that can provide support for the components mounted to the PCB 105. However, the various layers shown in FIG. 1 can form either a rigid PCB that is not intended to bend or curve or a flexible PCB (i.e., a flex PCB) in which case the dielectric layers 130 are not rigid. The ground planes 135 can be conductive layers, e.g., copper sheets.

In this embodiment, respective processors 110 are coupled by solder 115 (e.g., solder bumps) to pads 120 on an outer surface of the PCB 105. The solder 115 may be part of a ball grid array that couples multiple I/O ports in the processors 110 to respective pads 120 in the PCB 105. Although FIG. 1 illustrates that each processor 110 has two solder connections to the PCB 105, the ball grid array can include any number of connections. For example, the dielectric waveguide 140 may be only one of a plurality of communication channels between the processors 110. That is, the pads 120, coaxial vias 125 and dielectric waveguide 140 may be repeated in the PCB 105 to provide separate high-speed communication channels between the processors 110. These communication channels may collectively form a high-speed bus.

The coaxial vias 125 each includes a center conductor 155 electrically insulated from an outer conductor 150 (e.g., a shield) by a dielectric 145. As shown, the center conductor 155 is coupled to a respective pad 122 to receive electromagnetic signals from, or transmit electromagnetic signals to, one of the processors 110. For example, the processor 110A may use the solder 115 and pad 120B to drive an electromagnetic data signal onto the center conductor 155 of coaxial via 125A. As described in more detail below, the center conductor 155 introduces the electromagnetic data signal into the dielectric waveguide 140 which guides the signal to center conductor 155 of the coaxial via 125B. Using the pad 120D and another solder connection 115, the electromagnetic data signal is received by the processor 110B. While the center conductor 155 is used to transmit the data signal, the outer conductor 150 is grounded. In this example, the outer conductors 150 in each of the coaxial vias 125 are coupled to a ground port via the pads 120A and 120C. Moreover, the outer conductors 150 are coupled to multiple ground planes 135. However, in other embodiments, the outer conductors 150 are coupled to the ground planes 135 but not to the processors 110 through the pads 120.

As shown, the outer conductor 150 surrounds the center conductor 155 in each of the coaxial vias 125. In an embodiment, both the outer conductor 150 and the center conductor 155 are cylindrical shape but can be any number of shapes (e.g., elliptical, rectangular, etc.). The outer conductor 150 forms an annular ring through which the center conductor 155 extends. However, the outer conductor 150 does not completely surround the center conductor 155 since the top portion of the center conductor 155 couples to the pad 120D and the bottom portion extends into the dielectric waveguide 140.

In an embodiment, the electromagnetic signals transmitted using the communication system 100 have wavelengths that are greater than the wavelengths of electromagnetic signals in the visible light spectrum or infrared spectrum. That is, the wavelengths of the electromagnetic signals used in system 100 may be greater than 1000 microns. Because of the inverse relationship between wavelength and frequency, the frequencies of the electromagnetic signals used in communication system 100 may be less than the frequencies of the infrared spectrum, e.g., less than 300 GHz. By using frequencies less than infrared or visible light, expensive and bulky optical transmitters and receivers can be avoided.

Although FIG. 1 illustrates communication between two processors 110, the multi-layer PCB 105 can be used to facilitate high speed communication between many different computing devices. For example, the PCB 105 may be part of a motherboard in a computing system that couples processors to each other as well as other periphery devices such as a graphics card, main memory, network controller, accelerators, and the like. Each of these connections may be facilitated by using one or more of the communication channels established by the dielectric waveguide 140 and the pair of coaxial vias 125.

Figure 2:
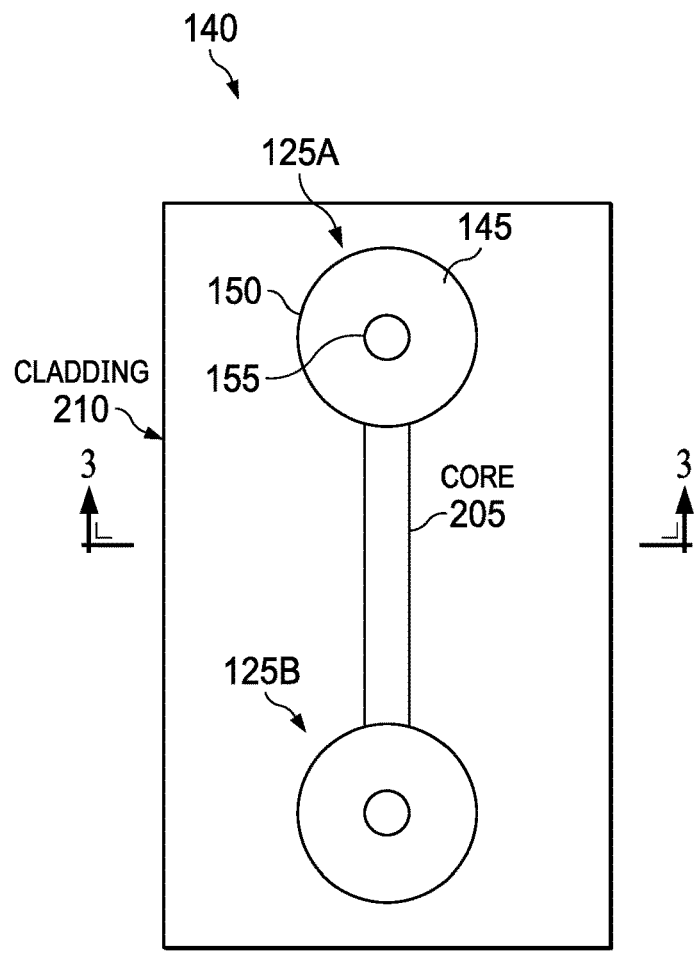
FIG. 2 is a diagram illustrating a top plan view of a dielectric waveguide coupled to coaxial vias in accordance with illustrative embodiments.

FIG. 2 is a diagram illustrating a top plan view of a dielectric waveguide coupled to coaxial vias in accordance with illustrative embodiments. FIG. 2 illustrates a top down view of the dielectric waveguide 140 where any dielectric layer or grounding planes above the waveguide 140 have been removed. As shown, the dielectric waveguide 140 includes a core 205 and cladding 210. The dielectric material of the core 205 has a higher dielectric constant than the dielectric material of the cladding 210. In an embodiment, the core 205 and cladding 210 directly contact such that there is no air gap between the two materials. Thus, electromagnetic signals propagating in the core 205 are reflected at the interface between the core 205 and cladding 210 such that the power of the electromagnetic signal is contained primarily within the core 205 (although some leakage may occur).

Any dielectric material can be used for the core 205 and the cladding 210 so long as the dielectric constants have the relationship described above. Further, if used in a multi-layer PCB, the dielectric material may have sufficient rigidity to provide support for the other layers in the PCB as well any components or devices mounted onto the PCB. Furthermore, the same dielectric material used for either the core 205 or the cladding 210 can also be used to form the other dielectric layers in the multi-layer PCB, e.g., layers 130 shown in FIG. 1.

The center conductor 155 in FIG. 2 extends through the outer conductor 150 to transmit electromagnetic signals into or out of the page. For example, the center conductor 155 in coaxial via 125A may transmit the electromagnetic signals into the core 205. Because of the difference in dielectric constants between the materials of the core 205 and the cladding 210, much of the power of the electromagnetic signal is contained within the core 205 as the signal travels down the core 205 to the coaxial via 125B. Once received by the center conductor 155 in coaxial via 125B, the center conductor 155 transmits the signal through the coaxial via 125B to a component or device coupled to the via 125B.

Figure 3:
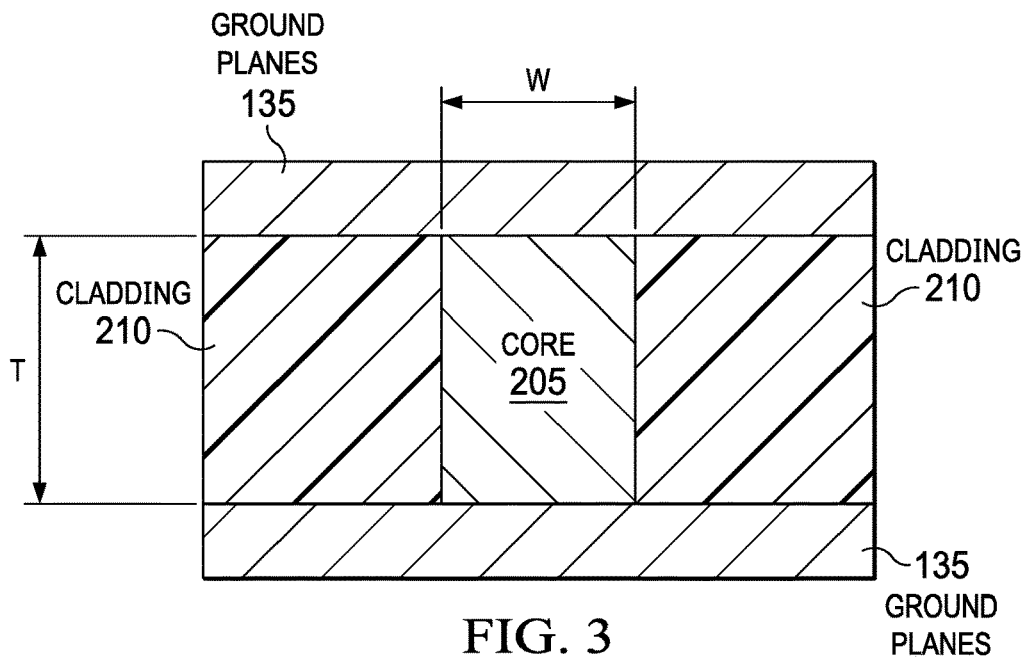
FIG. 3 depicts a cross section view of the dielectric waveguide along the dotted lines A-A in FIG. 2, in accordance with illustrative embodiments.

FIG. 3 depicts a cross section view of the dielectric waveguide along the dotted lines A-A in FIG. 2, in accordance with illustrative embodiments. As shown, the core 205 and cladding 210 are sandwiched between a pair of ground planes 135. The material of the core 205 directly contacts the material of the cladding 210 such that there is no air gap between the materials. Similarly, the core 205 and cladding 210 directly contact the conductive material of the ground planes 135 (e.g., copper foil).

In an embodiment, the thickness (T) of the core 205 and cladding is between 0.2 mm and 0.5 mm. The width (W) of the core 205 may be between 0.1 to 2 mm, or in another example, between 0.2 and 0.5 mm. The specific width and thickness of the core 205 can vary depending on the frequency or wavelength of the electromagnetic signal transmitted in the dielectric waveguide. For example, the core 205 may have a wider width if used to transmit signals with larger wavelengths.

Although FIGS. 1-3 depict only a single waveguide 140, the multi-layer PCB 105 can in fact include multiple waveguides. However, dense sets of dielectric waveguides contained within a PCB are potentially susceptible to high levels of crosstalk. The present disclosure provides a method of filtering between neighboring dielectric waveguides by embedding band stop filters directly within the waveguide core to reduce crosstalk noise. This is achieved by using PBG structures made of alternating high-low dielectric constants. These structures can be designed such that one frequency band, or multiple, can be filtered for each individual waveguide. The filter designs are implemented in waveguides operating up to 130 GHz, and can be designed to have a relatively high Q-factor. In addition, the filters are used to reduce the crosstalk among waveguides at different operating frequencies to improve the data band isolation and crosstalk properties.

Figure 4:
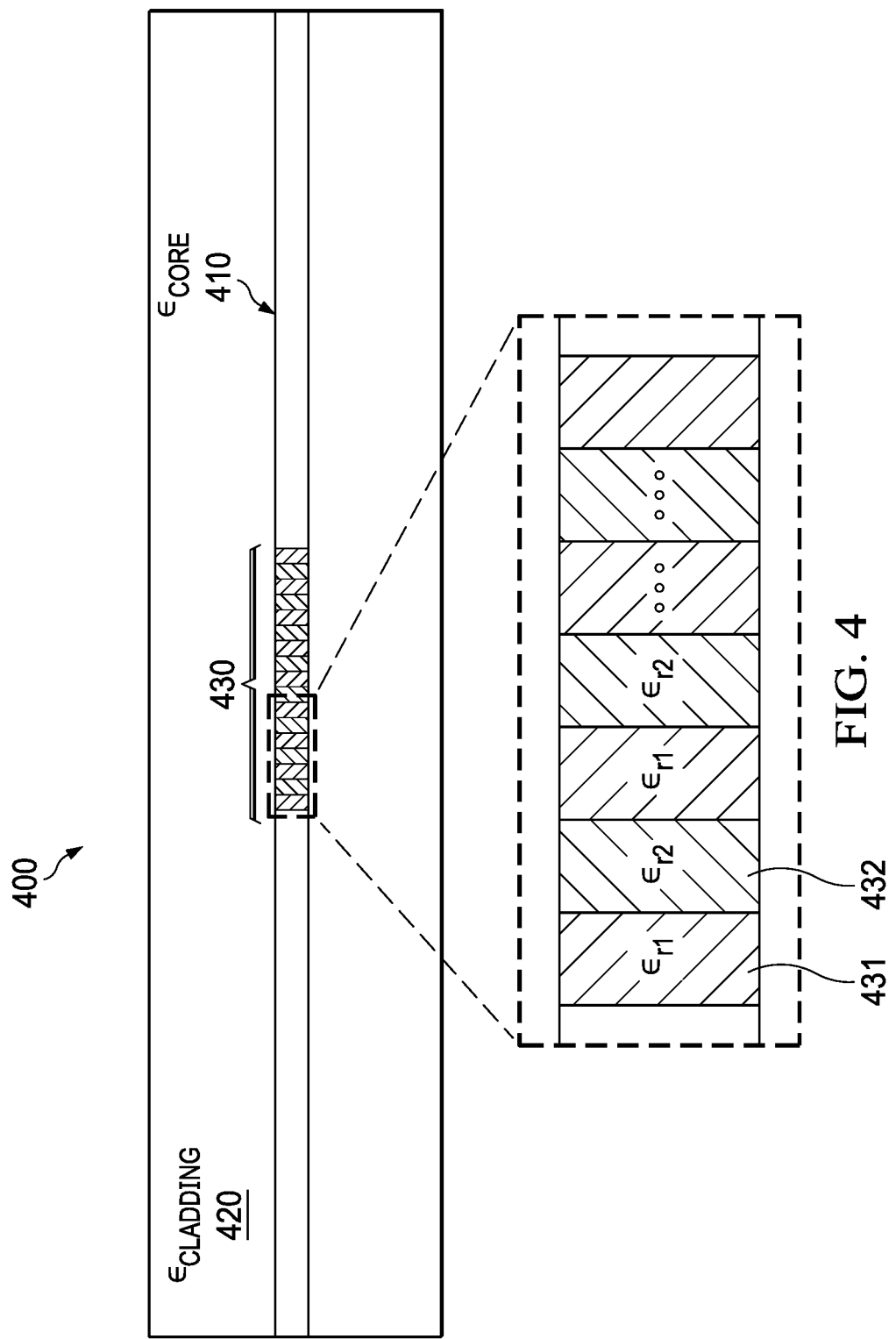
FIG. 4 is a diagram depicting a dielectric waveguide with an embedded band stop filter in accordance with illustrative embodiments.

FIG. 4 is a diagram depicting a dielectric waveguide with an embedded band stop filter in accordance with illustrative embodiments. The dielectric waveguide 400 comprises a core region 410 made of a high dielectric constant material, and a cladding region 420 made of a lower dielectric constant material. As in FIGS. 1-3, within the context of a PCB the core 410 and cladding 420 are sandwiched between PCB copper ground planes on the top and bottom surfaces (not shown in FIG. 4). In an embodiment, the materials have frequency independent parameters, where the core region material 410 has a permitivitty $\varepsilon_{core}=3.46$ with a loss tangent of 0.002, and the cladding material 420 has a $\varepsilon_{cladding}=2.1$ with a loss tangent of 0.001.

The band stop filter 430 is made of alternating high/low dielectric constant material sections 431, 432 which are embedded directly into the core 410 of the waveguide 400. The length of each dielectric material section 431, 432 is equal to a quarter wavelength of the central frequency of the stop band.

The Q-factor of the filter 430 is directly proportional to the number of transitions of high-to-low dielectric constants that are embedded within the waveguide. Each transition between dielectric constants/permitivitties $\varepsilon_{r1}$ and $\varepsilon_{r2}$ is referred to as one filter stage. In an embodiment, the dielectric properties of the filter 430 are $\varepsilon_{r1}=\varepsilon_{cladding}$ and $\varepsilon_{r2}=\varepsilon_{core}$, with the loss tangents also equal to those of the cladding 420 and core 410 respectively.

Figure 5:
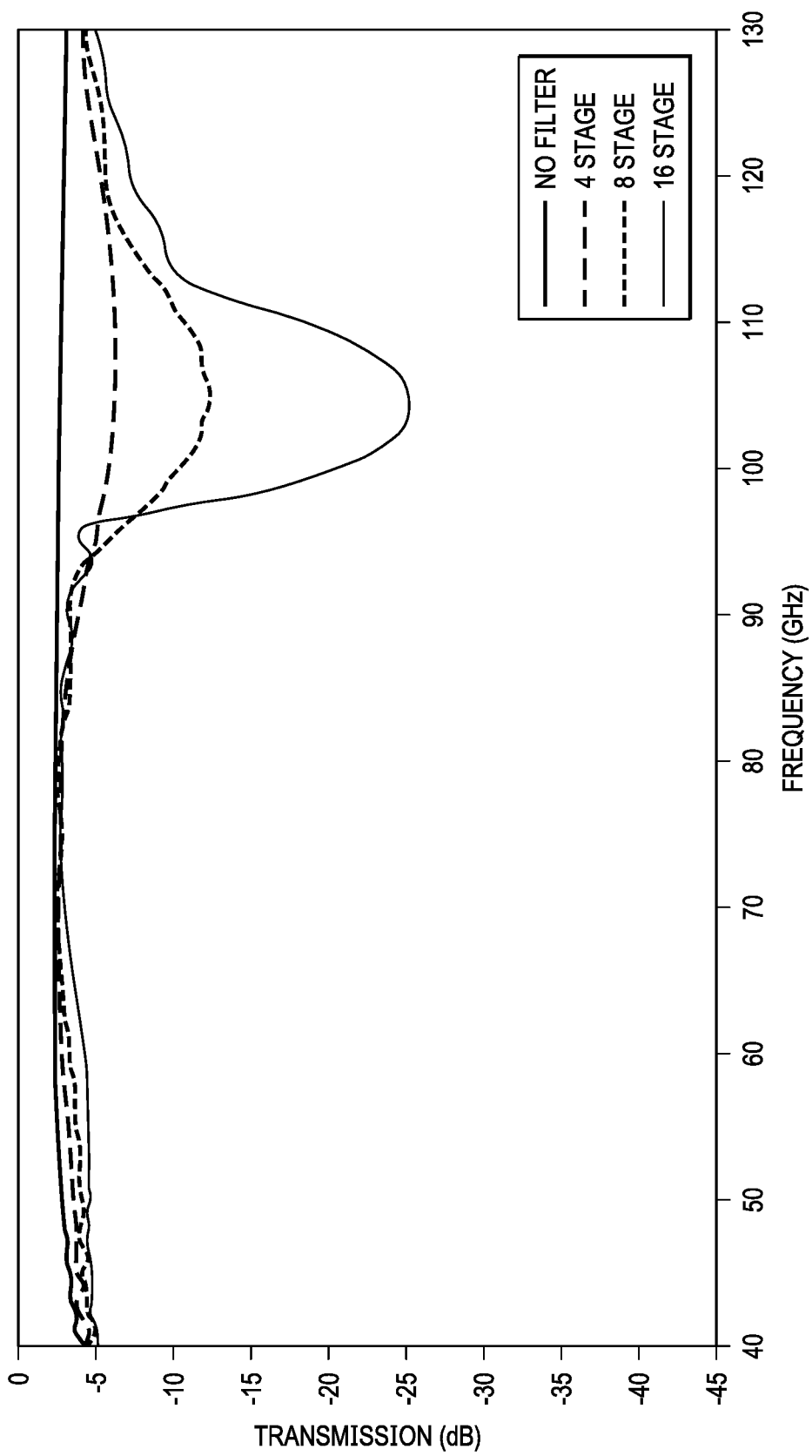
FIG. 5 is a graph depicting the transmission coefficient of the dielectric waveguide with the embedded filter as a function of number of filter stages in accordance with illustrative embodiments.

FIG. 5 is a graph depicting the transmission coefficient of the dielectric waveguide with the embedded filter as a function of number of filter stages in accordance with illustrative embodiments. FIG. 5 compares different numbers of filter units (4, 8, and 16) against a waveguide with no embedded filter. In this example, $\varepsilon_{r1}=\varepsilon_{cladding}$ and $\varepsilon_{r2}=\varepsilon_{core}$, and the resonant frequency for the filter is approximately 105 GHz. The length of each dielectric section is a quarter of a wavelength long. As depicted in the graph, as the number of stages increased, the Q of the filter is also increased. With 18 filter stages, the minimum magnitude of the transmission is approximately −25 dB.

In addition to using the same dielectric properties as the cladding for one of the filter sections, a third dielectric material can be used instead. In this case, the dielectric constant should be larger than the permittivity of the cladding to ensure the wave does not leak into the cladding away from the core.

Figure 6:
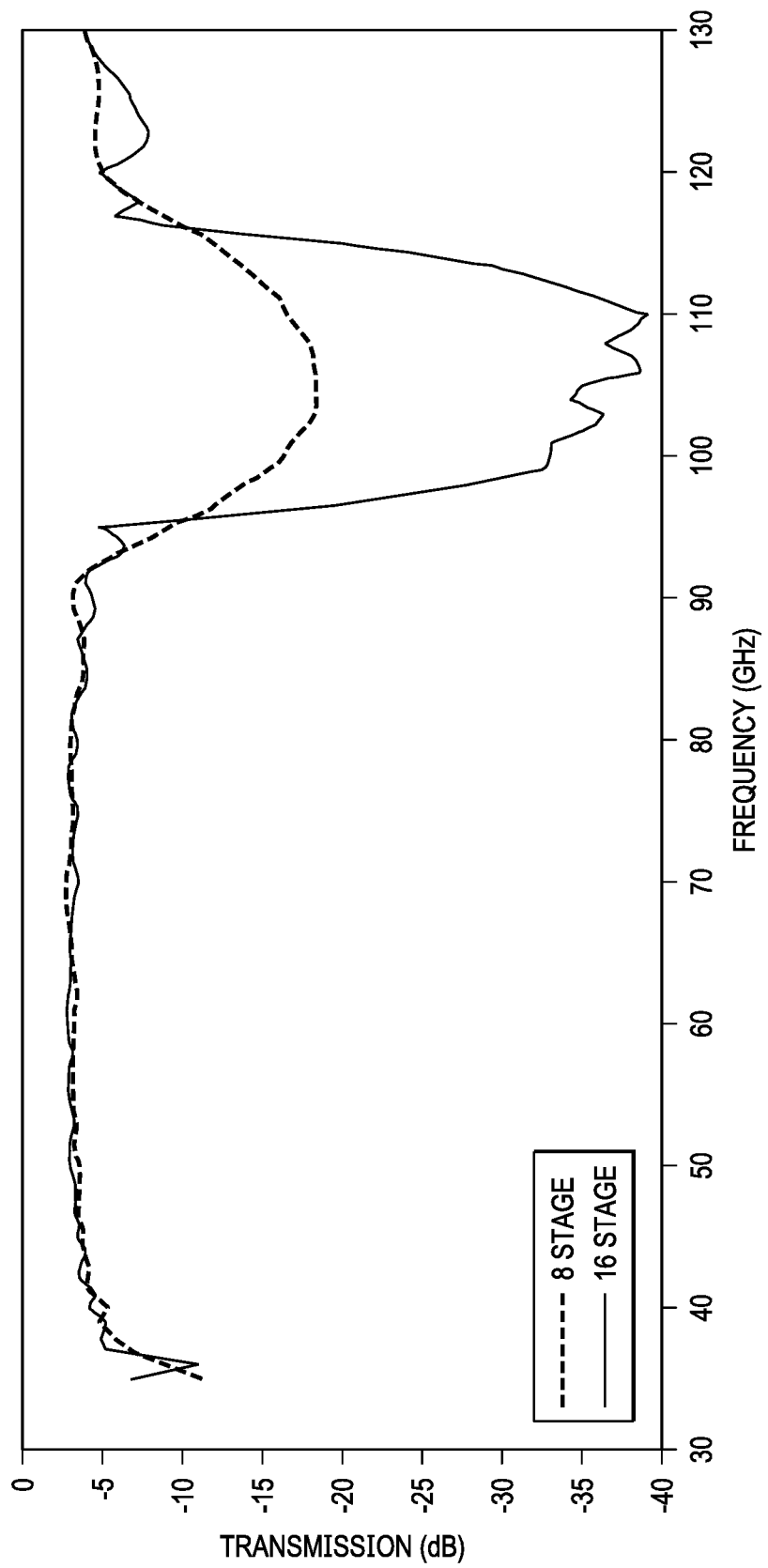
FIG. 6 is a graph depicting the transmission coefficient of the dielectric waveguide with a filter incorporating a third dielectric material different from the cladding in accordance with illustrative embodiments.

FIG. 6 is a graph depicting the transmission coefficient of the dielectric waveguide with a filter incorporating a third dielectric material different from the cladding in accordance with illustrative embodiments. In this example a material with a permittivity of $\varepsilon_{r1}=6.15$ with a 0.001 loss tangent is used for the filter, while $\varepsilon_{r2}=\varepsilon_{core}$. As shown in graph, the transmission through the waveguide with 16 stages has a lower minima at approximately −40 dB compared to the result in FIG. 5 with the same number of filter stages. This difference can be attributed to the larger difference between the permittivities of the alternating filter sections. Additional filters can also be embedded within a single waveguide to create a multi-band filter.

Figure 7:
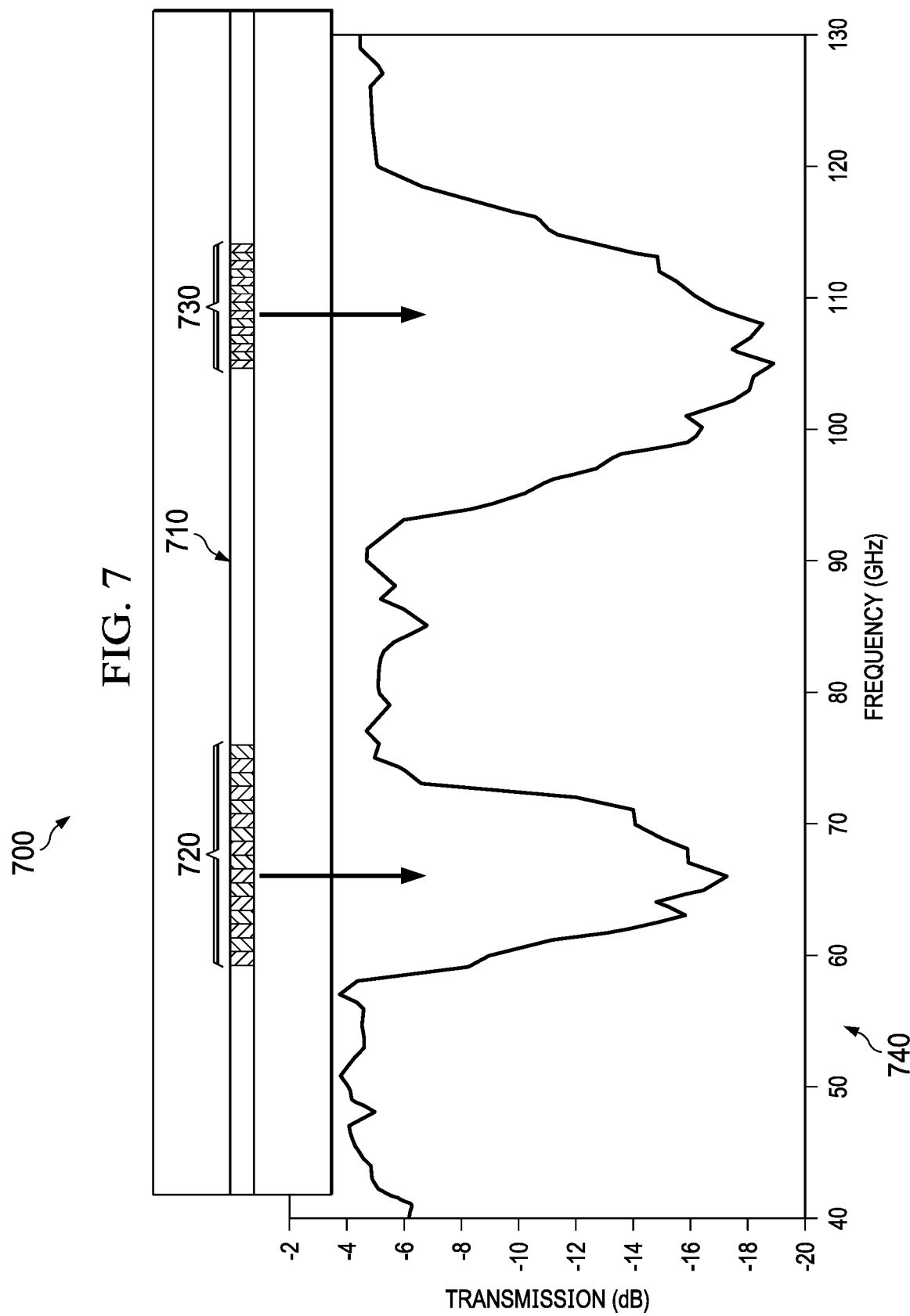
FIG. 7 is a diagram and graph depicting a multi-band embedded filter in accordance with an illustrative embodiment.

FIG. 7 is a diagram and graph depicting a multi-band embedded filter in accordance with an illustrative embodiment. In this embodiment, two filters 720 and 730 are embedded in the core 710. Filter 730 is designed to have a stop band centered at 105 GHz, and filter 720 has a stop band centered at 65 GHz. It should be emphasized the stop bands illustrated in the present example are chosen merely for ease of illustration and that the present disclosure can be applied to any desired stop band. In this illustrative embodiment, the dielectric properties of each filter are the same as the example shown in FIG. 6, with $\varepsilon_{r1}=6.15$ and $\varepsilon_{r2}=\varepsilon_{core}$. The length of each dielectric section is calculated to be a quarter wavelength at 65 and 105 GHz, respectively, and 8 stages are used for each filter.

The transmission of the waveguide is shown in graph 740. The transmission clearly shows strong filtering properties at both design frequencies. The minimum of each stop band also matches the 8-stage filter made of the same materials shown in FIG. 6, indicating that embedding additional filters within one waveguide does not have a negative effect on the properties of each individual filter while having a minimum impact on the transmission frequency bands. Being able to implement multiple filters in one waveguide can be useful for band-isolation in signaling applications, allowing only one frequency band to be used, which in the present example is approximately 70-95 GHz.

Figure 8:
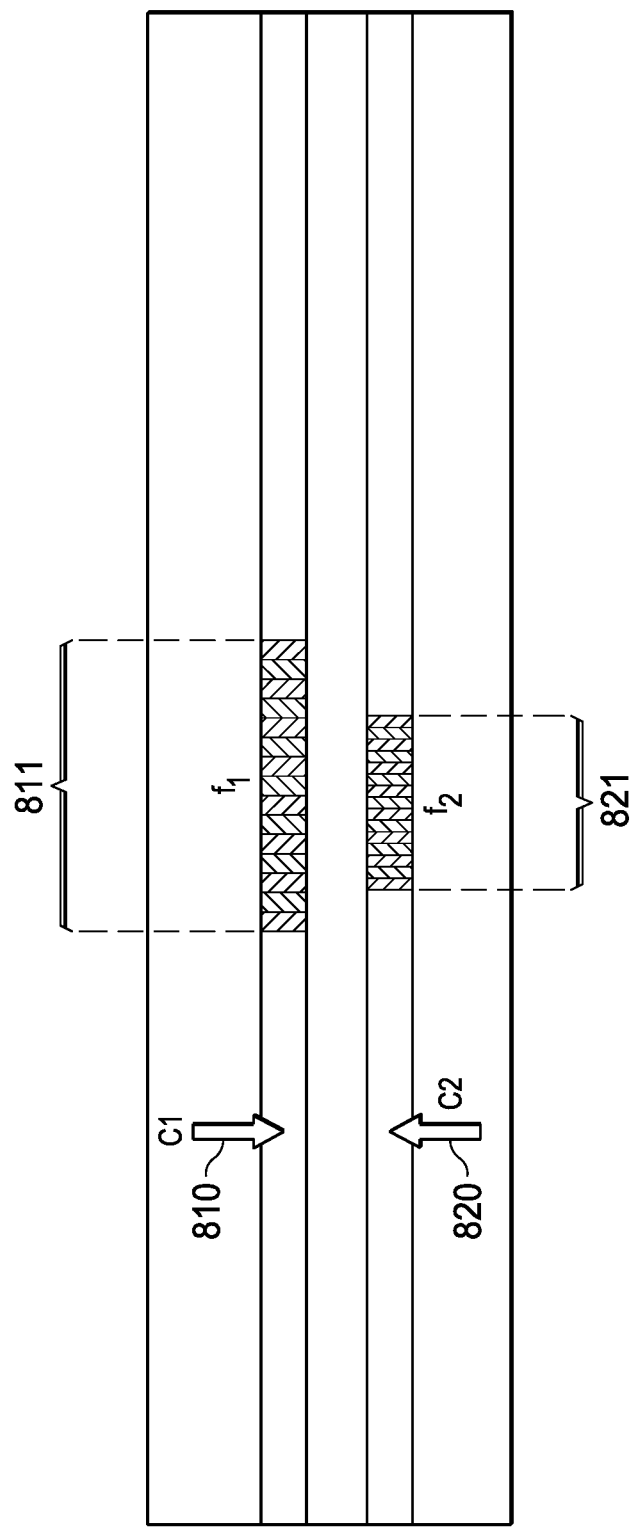
FIG. 8 depicts two dielectric waveguides with embedded filters designed to reduce cross talk in accordance with an illustrative embodiment.

FIG. 8 depicts two dielectric waveguides with embedded filters designed to reduce cross talk in accordance with an illustrative embodiment. In a set of waveguides, each waveguide can transmit a data with a certain frequency band centered around a carrier frequency. In order to ensure clean transmission of the carrier frequency band of an individual waveguide, filters can be added to the neighboring waveguides to filter out the harmonics of the carrier frequency bands of their neighbors.

In the example embodiment shown in FIG. 8 comprises a set of two dielectric waveguides 810 and 820 with one filter embedded within each waveguide. Waveguide 810 carries a signal with a carrier frequency C1 and has a filter 811 with a stop band centered around frequency f1. Waveguide 820 carries a signal having a carrier frequency C2 and has a filter 821 with a stop band centered around frequency f2 such that f1=C2 and f2=C1. This configuration ensures that the crosstalk harmonics generated from each waveguide do not interfere in the range of each waveguide's respective carrier frequency band.

Figure 9:
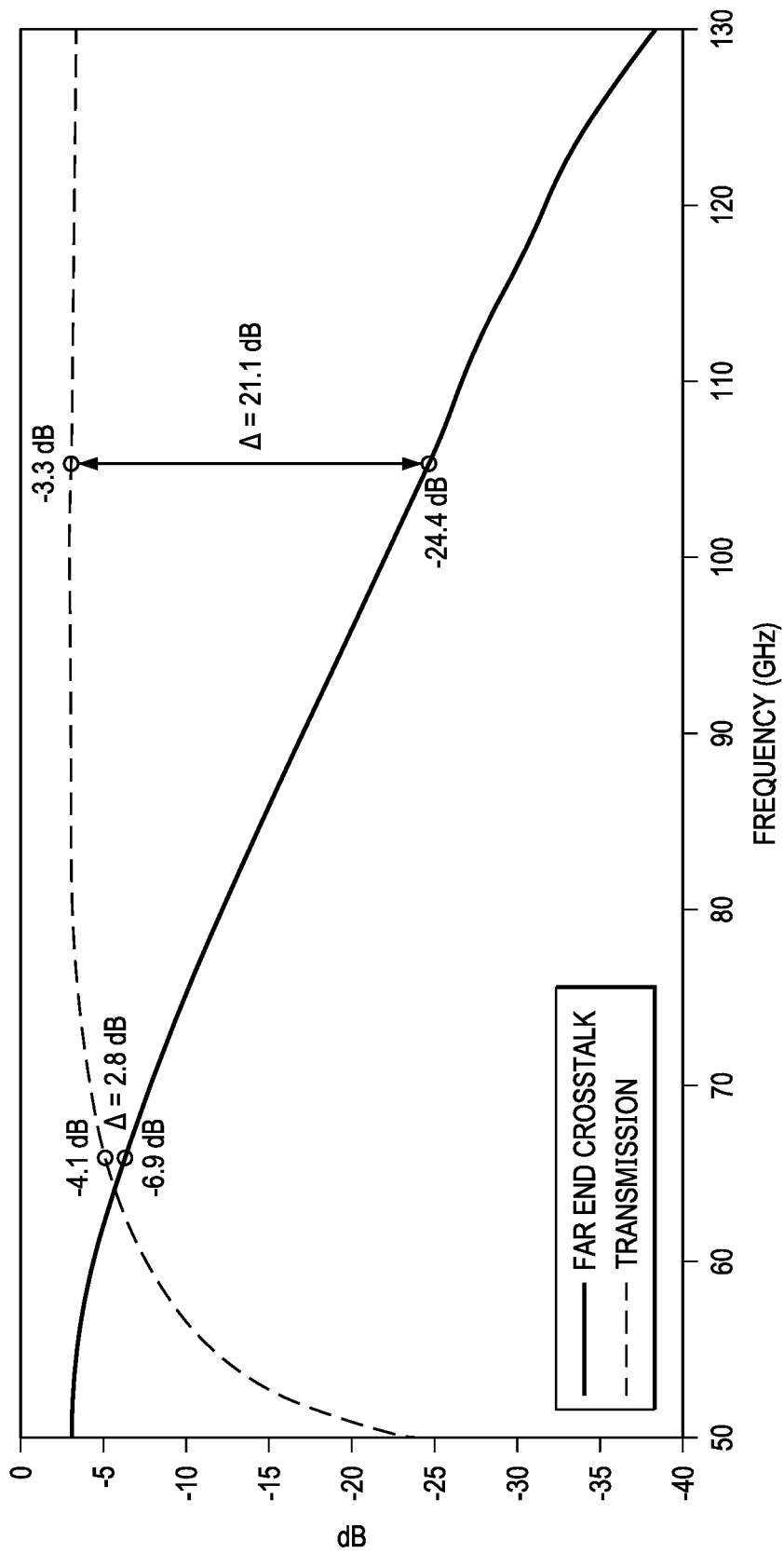
FIG. 9 is a graph depicting transmission and far end crosstalk between neighboring waveguides with no filters.

FIG. 9 is a graph depicting transmission and far end crosstalk neighboring waveguides with no filters. In this example, the crosstalk and transmission on each waveguide is identical, and the filtering frequencies are chosen to be f1=65 GH, and f2=105 GHz, with 8 stages with dielectric properties of $\varepsilon_{core}=3.46$, $\varepsilon_{cladding}=2.1$, $\varepsilon_{r1}=6.15$, and $\varepsilon_{r2}=\varepsilon_{core}$. At the frequencies of interest mentioned above, the difference between the crosstalk and transmission ($\Delta$) is 2.8 dB at 65 GHz and 21.1 dB at 105 GHz.

Figure 10:
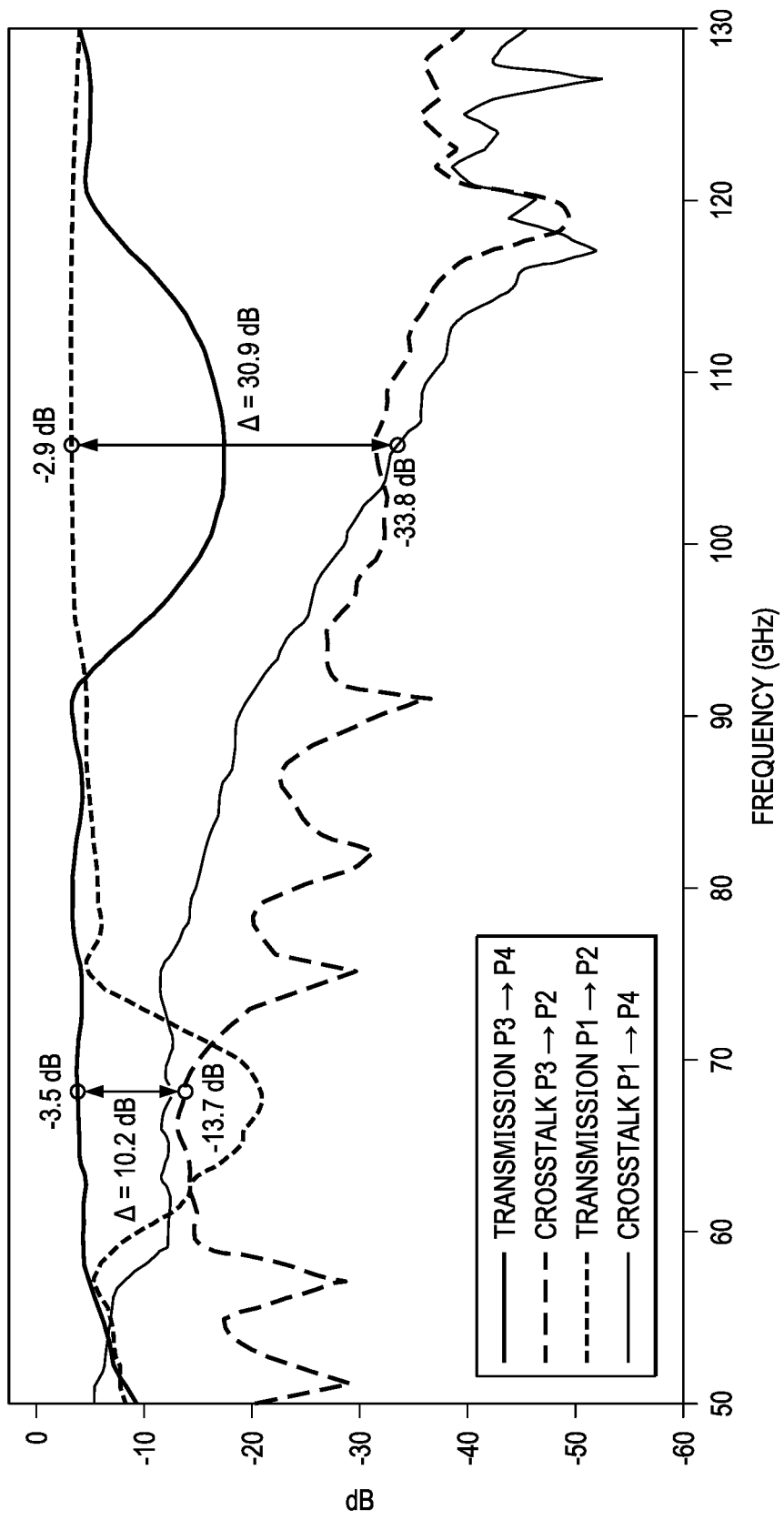
FIG. 10 is a graph depicting transmission and crosstalk between neighboring waveguides with filters added in accordance with an illustrative embodiment.

FIG. 10 is a graph depicting transmission and crosstalk of the same set of neighboring waveguides with the filters added in accordance with an illustrative embodiment. In this example, the transmission shows strong filtering at the 65 GHz and 105 GHz, as expected. It can also be observed that A is increased by approximately 7 dB and 10 dB, at 65 GHz and 105 GHz, respectively, by achieving a lower crosstalk and higher transmission. These results show that the embedded filters can be used to minimize crosstalk between neighboring dielectric waveguides at their respective carrier frequency centered data bands.

It should be understood that the figures are not to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

For purposes of the description hereinafter, the terms "upper," "lower," "right," "left," "vertical," "horizontal," "top," "bottom," and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element.

In this disclosure, when an element, such as a layer, region, or substrate is referred to as being "on" or "over" another element, the element can be directly on the other element or intervening elements can also be present. In contrast, when an element is referred to as being "directly on," "directly over," or "on and in direct contact with" another element, there are no intervening elements present, and the element is in contact with another element.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A dielectric waveguide layer, comprising:
a first dielectric core forming a first waveguide;
a cladding disposed on opposite sides of the dielectric core, wherein the cladding has a lower dielectric constant than the first dielectric core;
a first filter embedded within the first dielectric core and configured to attenuate transmission of a first frequency band through the first waveguide, wherein the first filter comprises alternating sections of a first dielectric material and a second dielectric material having different dielectric constants, and wherein a length of each section of the first and second dielectric materials within the first filter is equal to a quarter of a wavelength of a central frequency of the first frequency band; and
a first conductive ground plane in contact with top surfaces of the first dielectric core, the second dielectric core, and the cladding; and
a second conductive ground plane in contact with bottom surfaces of the first dielectric core, the second dielectric core, and the cladding.

2. The waveguide layer of claim 1, wherein the first dielectric material in the first filter has a dielectric constant equal to the dielectric constant of the first dielectric core.

3. The waveguide layer of claim 1, wherein the second dielectric material in the first filter has a dielectric constant equal to the dielectric constant of the cladding.

4. The waveguide layer of claim 1, wherein the second dielectric material in the first filter has a dielectric constant higher than the dielectric constant of the cladding.

5. The waveguide layer of claim 1, wherein the first filter has a Q factor that is directly proportional to a number of transitions between the first and second dielectric materials.

6. The waveguide layer of claim 1, further comprising a second filter embedded in the first dielectric core and configured to attenuate transmission of a second frequency band through the first waveguide, wherein the second filter comprises alternating sections of the first dielectric material and the second dielectric material, and wherein a length of each section of the first and second dielectric materials within the second filter is equal to a quarter of a wavelength of a central frequency of the second frequency band.

7. The waveguide layer of claim 1, further comprising:
a second dielectric core forming a second waveguide separated from the first waveguide by the cladding; and
a second filter embedded in the second dielectric core and configured to attenuate transmission of a second frequency band through the second waveguide, wherein the second filter comprises alternating sections of the first dielectric material and the second dielectric material, and wherein a length of each section of the first and second dielectric materials within the second filter is equal to a quarter of a wavelength of a central frequency of the second frequency band;
wherein the second frequency band equals a third frequency band transmitted through the first waveguide, and wherein the first frequency band equals a fourth frequency band transmitted through the second waveguide.

8. A multi-layer printed circuit board (PCB), comprising:
a first dielectric core forming a first waveguide configured to transmit a first frequency band;
a first filter embedded within the first dielectric core and configured to attenuate transmission of a second frequency band through the first waveguide, wherein the first filter comprises alternating sections of a first dielectric material and a second dielectric having different dielectric constants, and wherein a length of each section of the first and second dielectric materials within the first filter is equal to a quarter of a wavelength of a central frequency of the second frequency band;
a second dielectric core forming a second waveguide configured to transmit the second frequency band;
a second filter embedded in the second dielectric core and configured to attenuate transmission of the first frequency band through the second waveguide, wherein the second filter comprises alternating sections of the first dielectric material and the second dielectric material, and wherein a length of each section of the first and second dielectric materials within the second filter is equal to a quarter of a wavelength of a central frequency of the first frequency band;
a cladding disposed between the first dielectric core and second dielectric core, wherein the cladding has a lower dielectric constant than a dielectric constant of the first and second dielectric cores;
a first conductive ground layer in contact with top surfaces of the first dielectric core, second dielectric core, and the cladding; and
a second conductive ground layer in contact with bottom surfaces of the first dielectric core, second dielectric core, and the cladding.

9. The PCB of claim 8, wherein the first and second dielectric cores have the same dielectric constant.

10. The PCB of claim 8, wherein the first dielectric material in the first filter has a dielectric constant equal to the dielectric constant of the first dielectric core.

11. The PCB of claim 8, wherein the second dielectric material in the first filter has a dielectric constant equal to the dielectric constant of the cladding.

12. The PCB of claim 8, wherein the second dielectric material in the first filter has a dielectric constant higher than the dielectric constant of the cladding.

13. The PCB of claim 8, wherein the first filter and the second filter have respective Q factors that are directly proportional to a number of transitions between the first and second dielectric materials in each filter.

14. A method of attenuating crosstalk between dielectric waveguides, the method comprising:
forming a first dielectric waveguide to carry a first frequency band;
embedding a first filter within the first dielectric waveguide to attenuate transmission of a second frequency band through the first dielectric waveguide, wherein the first filter comprises alternating sections of a first dielectric material and a second dielectric material having different dielectric constants, and wherein a length of each section of the first and second dielectric materials within the first filter is equal to a quarter of a wavelength of a central frequency of the second frequency band;
forming a second dielectric waveguide to carry the second frequency band;
embedding a second filter in the second dielectric waveguide to attenuate transmission of the first frequency band through the second dielectric waveguide, wherein the second filter comprises alternating sections of the first dielectric material and the second dielectric material, and wherein a length of each section of the first and second dielectric materials within the second filter is equal to a quarter of a wavelength of a central frequency of the first frequency band; and
disposing a cladding between the first dielectric waveguide and second dielectric waveguide, wherein the cladding has a lower dielectric constant than a dielectric constant of the first and second dielectric waveguides.

15. The method of claim 14, wherein the first and second dielectric waveguides have the same dielectric constant.

16. The method of claim 14, wherein the first dielectric material in the first filter has a dielectric constant equal to the dielectric constant of the first dielectric waveguide.

17. The method of claim 14, wherein the second dielectric material in the first filter has a dielectric constant equal to the dielectric constant of the cladding.

18. The method of claim 14, wherein the second dielectric material in the first filter has a dielectric constant higher than the dielectric constant of the cladding.

19. The method of claim 14, wherein the first filter and the second filter have respective Q factors that are directly proportional to a number of transitions between the first and second dielectric materials in each filter.

20. The method of claim 14, further comprising embedding a third filter in the first dielectric waveguide to attenuate transmission of a third frequency band through the first dielectric waveguide, wherein the third filter comprises alternating sections of the first dielectric material and the second dielectric material, and wherein the length of each section of the first and second dielectric materials within the second filter is equal to a quarter of a wavelength of a central frequency of the third frequency band.

\* \* \* \* \*